United States Patent [19]

Yong et al.

[11] Patent Number: 5,255,094
[45] Date of Patent: Oct. 19, 1993

[54] MUTING CIRCUIT FOR ELIMINATING TRANSIENT SIGNALS GENERATED DUE TO POWER SUPPLY TURN-ON AND TURN-OFF

[75] Inventors: Lui T. Yong; Goh S. Tiam, both of Singapore, Singapore

[73] Assignee: Thomson Consumer Electronics, S.A., Courbevoie, France

[21] Appl. No.: 594,777

[22] Filed: Oct. 10, 1990

[51] Int. Cl.$^5$ .............................................. H04N 5/60
[52] U.S. Cl. .................................. 358/165; 455/212; 455/222; 330/51
[58] Field of Search ............... 358/198, 191.1, 192.1, 358/193.3, 188, 165, 190; 455/194, 200, 222, 212, 219–221; 330/51

[56] References Cited

U.S. PATENT DOCUMENTS

| | | | |
|---|---|---|---|
| 3,840,820 | 10/1974 | Kawada | 330/207 |
| 3,916,321 | 10/1975 | Morse | 325/478 |
| 4,181,895 | 1/1980 | Yoshida | 330/279 |
| 4,366,442 | 12/1982 | Yamada | 330/51 |
| 4,383,136 | 5/1983 | Numata et al. | 179/1 |
| 4,405,948 | 9/1983 | Griffis | 358/198 |
| 4,427,949 | 1/1984 | Yamaguchi et al. | 330/51 |
| 4,433,306 | 2/1984 | Honda et al. | 330/297 |
| 4,435,684 | 3/1984 | Page | 330/51 |
| 4,438,527 | 3/1984 | Hammond | 381/107 |
| 4,441,086 | 4/1984 | Karlow et al. | 330/297 |
| 4,490,838 | 12/1984 | Nishioka et al. | 381/15 |
| 4,491,800 | 1/1985 | Miyata | 330/51 |
| 4,542,421 | 9/1985 | Fujibayashi | 360/67 |
| 4,543,539 | 9/1985 | Seki et al. | 330/297 |
| 4,581,541 | 4/1986 | Nakayama et al. | 307/243 |
| 4,600,947 | 7/1986 | Chamberlain et al. | 358/165 |
| 4,627,101 | 12/1986 | Anderson et al. | 455/194 |
| 4,628,539 | 12/1986 | Selwa | 455/194 |
| 4,641,190 | 2/1987 | Testin et al. | 358/165 |
| 4,656,573 | 4/1987 | Lee | 358/190 |
| 4,673,889 | 6/1987 | Cini et al. | 330/51 |
| 4,723,167 | 2/1988 | Griffey | 358/190 |
| 4,829,594 | 5/1989 | Heck et al. | 455/214 |
| 4,864,155 | 9/1989 | Schmitz | 307/112 |
| 4,983,927 | 1/1991 | Torazzina | 330/51 |
| 5,029,005 | 7/1991 | Morris, Jr. | 358/165 |

FOREIGN PATENT DOCUMENTS

| | | |
|---|---|---|
| 0106953 | 5/1984 | European Pat. Off. . |
| 0280327 | 8/1988 | European Pat. Off. . |
| 57-192110 | 11/1982 | Japan ............................. 330/51 |
| 2104745 | 3/1983 | United Kingdom . |
| 2129239 | 5/1984 | United Kingdom . |
| 2172458 | 9/1986 | United Kingdom . |

*Primary Examiner*—James J. Groody
*Assistant Examiner*—Glenton B. Burgess
*Attorney, Agent, or Firm*—Joseph S. Tripoli; Peter M. Emanuel; Frederick A. Wein

[57] ABSTRACT

A muting circuit for eliminating transient signals generated due to power supply "turn-on" and "turn-off" is presented. In one embodiment, a junction in a signal chain is AC shunted to ground independent of the DC status of the junction. This shunting is in response to a signal generated by a power supply controlling microprocessor when the microprocessor energizes or de-energizes the power supply for a portion of the signal chain coupling signal to the acted upon junction. In another embodiment, the junction is AC coupled to ground during turn-on through a diode in series with a capacitor with the diode first being forward biased and then reverse biased to remove the AC shunt. The biassing of the diode is accomplished by application of two different sources of voltage to respective electrodes of the diode.

6 Claims, 2 Drawing Sheets

MUTING CIRCUIT FOR ELIMINATING TRANSIENT SIGNALS GENERATED DUE TO POWER SUPPLY TURN-ON AND TURN-OFF

BACKGROUND OF THE INVENTION

The present invention concerns an audio signal processing system in a television receiver or the like arranged to suppress the audible effects of transients produced when the system is energized or de-energized.

In an audio-frequency amplifier, sound is sometimes generated from a loudspeaker of the system when the system is energized and de-energized. Upon turn-on or turn-off of the TV receiver, the audio circuit may produce a very noticeable "pop" or "click" despite the absence of noise at its input because of rapid transitions of potentials within the amplifier or components coupled to the amplifier due to power supply transitions. If such a phenomenon occurs in a pre-amplifier, the aforesaid sound can be greatly amplified by the power amplifier. To eliminate this source of undesirable sound or noise, it is desirable to silence or mute the signal during these transient conditions. Accordingly, the audible effects of transients associated with energization and de-energization of the system are suppressed by apparatus arranged according to the present invention.

SUMMARY OF THE INVENTION

Briefly, the present invention concerns a muting circuit for eliminating transient signals generated due to power supply "turn-on" and "turn-off". In one embodiment, a junction in a signal chain is AC shunted to ground independent of the DC status of the junction. This shunting is in response to a signal generated by a power supply controlling microprocessor when the microprocessor energizes or de-energizes the power supply for a portion of the signal chain coupling signal to the acted upon junction. In another embodiment, the junction is AC coupled to ground during turn-on through a diode in series with a capacitor with the diode first being forward biased and then reverse biased to remove the AC shunt. The biassing of the diode is accomplished by application of two different sources of voltage to respective electrodes of the diode.

BRIEF DESCRIPTION OF THE DRAWINGS

Reference may be had to the drawings wherein.

DETAILED DESCRIPTION OF THE PREFERRED EMBODIMENT

Figure 1:
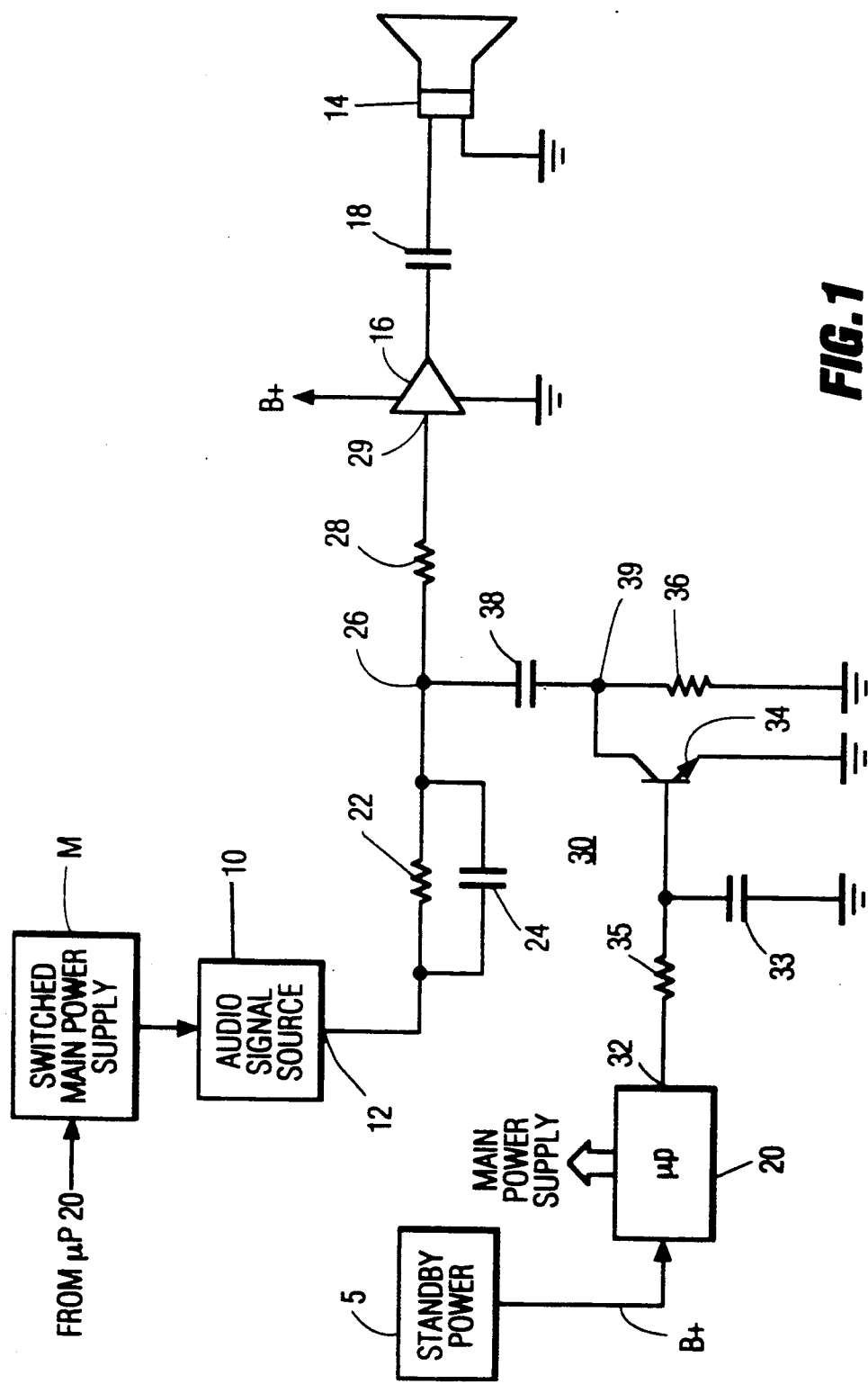
FIG. 1 shows, partly in block diagram form and partly in schematic form, one embodiment of a portion of an audio signal processing network of a television receiver comprising apparatus according to an aspect of the present invention.

Referring now to the drawings wherein like members have been designated like numbers, there is shown in FIG. 1 an integrated circuit (IC) source of audio signals 10. In the exemplary embodiment, audio signal source 10 is an integrated circuit M52038SP which also performs intermediate frequency (IF) video and sound processing in a color television receiver, provides color processing, and provides a video signal for driving a cathode ray tube (not shown). One of the functions of IC 10 is to detect the sound from a program source and provide such an audio signal at output terminal 12.

The low level audio signals at terminal 12 require further voltage and power amplification in order to drive loudspeaker 14 or the like, and such amplification is provided by amplifier 16 which in the exemplary embodiment is a TDA2030 integrated circuit coupled to loudspeaker 14 through capacitor 18. The main power supply is controlled by microprocessor 20 which also controls other functions, e.g., X-ray protection, and remote control commands. In many microprocessor controlled television receivers, there are a plurality of power supplies including a stand-by power supply so that the receiver can respond to a remote command to turn the set "on".

Circuit 10 is powered by a main power supply M controlled by microprocessor 20, which in the exemplary embodiment is a TEA2260. However, amplifier 16 is constantly powered by a "stand-by" power supply because, in the exemplary embodiment, switching power supply S current to amplifier 16 would require a switch of higher current capability than is provided within microprocessor 20.

Audio signals provided at terminal 12 are DC coupled via the parallel combination of resistor 22 and capacitor 24 to node or junction 26 wherein the signal is DC coupled to non-inverting input terminal 29 of amplifier 16 via resistor 28. Amplifier 16 is provided with feedback and frequency compensation components (not shown) coupled to the inverting input terminal (not shown). In the exemplary embodiment, DC bias for terminal 29 of amplifier 16 is provided by terminal 12 of IC 10. When the main power supply M which powers circuit 10 is de-energized (turned "off") or energized (turned "on") by microprocessor 20, transient DC voltages within circuit 10 are caused to be generated by the increasing or decreasing of power supply voltages. These transient generated signals propagate through the system and are amplified as a noise emitted by loudspeaker 14.

It is desirable to eliminate this transient generated noise in a manner which does not effect the DC quiescent status of the system otherwise the transient elimination circuit will introduce its own noise into the system. To this end, the transient noise elimination circuit 30 is provided. The microprocessor 20 of the exemplary embodiment provides what is called a "standby" signal at terminal 32 which, when it goes high, indicates that the main power supply M has been switched "off". This "standby" signal can be provided by other appropriate means, such as another circuit powered from the standby power supply and providing a signal responsive to the status of the main power supply M.

The standby signal at terminal 32 is low-pass frequency filtered by series resistor 35 and shunt capacitor 33 and is coupled to a base electrode of NPN transistor 34. Transistor 34 has an emitter electrode coupled ground and a collector electrode coupled to a junction 39 of a resistor 36 and a capacitor 38 with the other end of resistor 36 coupled to ground and the other end of capacitor 38 coupled to node 26. In this manner, there is a signal divider between resistor 22 and resistor 36. Capacitor 38 isolates the DC voltage at junction 26 from resistor 36 and transistor 34.

With a forward bias provided at the base-emitter junction of transistor 34 by the "standby" signal, the collector-emitter impedance to ground decreases so as to present a shunt impedance of a value much lower than resistor 36, which has a value of 10K ohms. This impedance change of transistor 34 is shown by commonly published emitter-collector characteristics for bipolar transistors for a family of base currents, that shows a sloped resistor-like characteristic for low collector voltages and currents. Thus, when the "standby" signal is present, the collector-emitter circuit shunts resistor 36 changing the signal divider ratio with resistor 22 and substantially attenuating any AC signal at junction 26 for the duration of the presence of the "standby" signal. Capacitor 38 prevents any change of the DC voltage present at junction 26 due to the shunting effect of transistor 34. In this manner, the AC signal at node 26 will be substantially attenuated without effecting the DC voltage level present at node 26.

When the main power supply M is energized, the standby signal is quickly provided from the standby power supply before the main power supply capacitors have developed appreciate charge. When the main power supply M is de-energized in response to a control signal initiated by microprocessor 20, the shunting effect of transistor 34 is maintained to eliminate the turn "off" transient by the charge maintained on capacitor 33 for a short time after the main power supply M is powered down.

Figure 2:
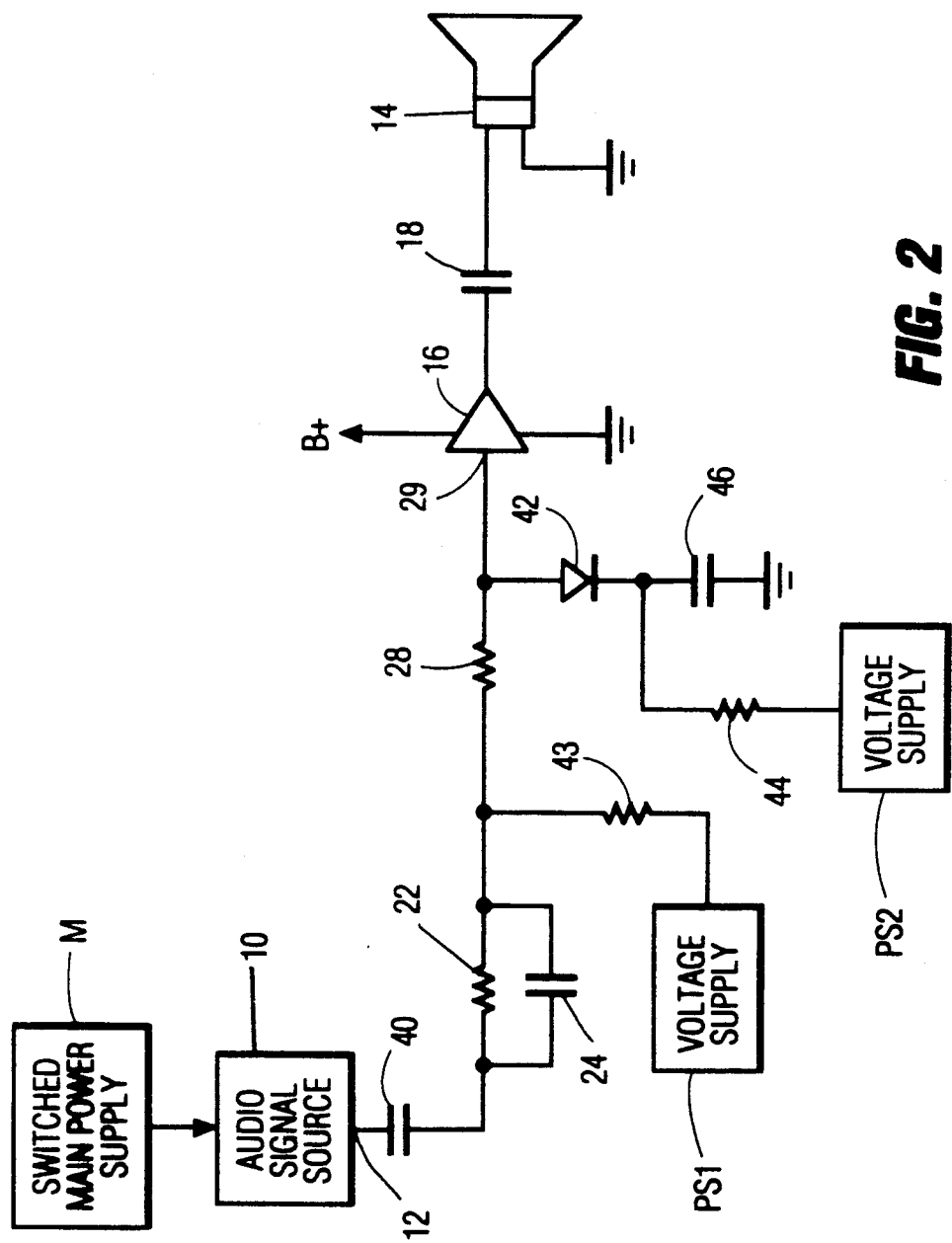
FIG. 2 shows, partly in block diagram form and partly in schematic form, another embodiment of a portion of an audio signal processing network of a television receiver comprising apparatus according to another aspect of the present invention.

However, there are instances where the DC coupling between two integrated circuits may be undesirable. In such an instance, the embodiment of FIG. 2 can be used wherein like members common to FIG. 1 are given the same numeral designations. IC 10 and amplifier 16 are AC signal coupled by capacitor 40 having a negligible impedance at the frequencies of interest, and accordingly the bias voltage for terminal 29 is provided through resistors 28 and 43 by voltage source ps1 which derives its voltage from the switched main power supply M. In this way, when the main power supply is switched "off", the bias supply will be cut off from terminal 29 thus muting any transient signals.

The operation of the pop-elimination upon turn "on" will now be discussed. A diode or other non-linear device 42 is coupled to input terminal 29 and poled for conduction through capacitor 46 to ground. The cathode of diode 42 is also coupled through resistor 44 to voltage source ps2 which also derives its voltage from the switched main power supply. Voltage sources ps1 and ps2, both derived from the switched main power supply, M will be zero volts after turn "off" if all power supply capacitors have had sufficient time to fully discharge. Upon turn "on", the switched main power supply M is energized as are ps1 and ps2. However, capacitor 46 has little or no charge and any bias appearing at terminal 29 causes diode 42 to be forward biased thus providing an AC shunt to ground through capacitor 46. This AC shunting of terminal 29 will continue until sufficient DC voltage is developed across capacitor 46 to switch "off" diode 42 by reverse biasing the diode. This is accomplished by having ps2 provide a higher steady state voltage than the steady state voltage provided by ps1, e.g., ps1 and ps2 being derived from a voltage divider off of the main power supply M with ps2 being tapped off at a higher voltage. When the voltage across capacitor 46 is approximately equal to the voltage provided at terminal 29 by ps1, the charging of capacitor 46 continues to the higher voltage of ps2 thus switching diode 42 "off" and removing the AC shunt to ground of capacitor 46 from terminal 29. Thus, terminal 29 is AC shunted to ground for a period of time after energization of the main power supply M eliminating transient noises during "turn-on", and said AC shunt is removed after a period of time permitting normal audio operation.

We claim:

1. A muting circuit for eliminating transient generated signals due to power supply turn-on and turn-off comprising:

a first amplifier having a signal input terminal, a second amplifier having a signal output terminal having a DC status and DC coupled to the signal input terminal of the first amplifier by a path, a switchable power supply coupled to the second amplifier, a microprocessor for switching the power supply between an "on" state and an "off" state, said microprocessor providing a microprocessor signal indicative of the power supply status, and means AC coupled to a junction in the path and responsive to the microprocessor signal for eliminating transient signals at the junction caused by switching the power supply from one state to another state but without disturbing the DC status of the junction.

2. A muting circuit for eliminating transient generated sounds due to power supply turn-on and turn-off comprising;

a first amplifier having a signal input terminal, a second amplifier having a signal output terminal having a DC status and DC coupled to the signal input terminal of the first amplifier by a path, a power supply coupled to the second amplifier, said power supply being switchable between an energized state and an unenergized state, and means AC coupled to a junction in the path for eliminating transient signals generated by the second amplifier when the power supply is switched between states without effecting the DC status of the junction.

3. A muting circuit for eliminating transient generated signals due to the changing of state of a power supply turn-on comprising:

a first amplifier having a signal input terminal, a second amplifier having a signal output terminal DC coupled to the signal input terminal of the first amplifier by a path, a switchable power supply coupled to the second amplifier, a first voltage supply means, a second voltage supply means, and coupling means responsive to the first and second voltage supply means and AC coupling a point of reference potential to a junction in the path for eliminating transient signals at the junction generated by switching the power supply from one state to another state.

4. A muting circuit for eliminating transient generated signals due to the changing of state of a power supply comprising:

a first amplifier having a signal input terminal, a second amplifier having a signal output terminal coupled to the signal input terminal of the first amplifier by a path, a switchable power supply coupled to the second amplifier, a first voltage supply means, a second voltage supply means, and coupling means responsive to the first and second voltage supply means and AC coupling a point of reference potential to a junction in the path for eliminating transient signals at the junction generated by switching the power supply from one state to another state, said coupling means comprising a diode coupled between the junction and the second voltage supply means, said diode being switchably biased during power supply "turn-on" from being forward biased to being reverse biased.

5. The circuit of claim 4 wherein said second coupling further comprises a capacitor coupled between the diode and AC ground, said capacitor being charged during power supply "turn-on".

6. The circuit or claim 5 wherein the power supply means charges the capacitor to a voltage higher than the first power supply means reverse biasing the diode.

* * * * *